(12) United States Patent
Kang (10) Patent No.: US 10,015,883 B2
(45) Date of Patent: Jul. 3, 2018

(54) LED PACKAGE FOR LAMP OF VEHICLE

(71) Applicant: HYUNDAI MOBIS CO., LTD, Seoul (KR)

(72) Inventor: Hyun Woo Kang, Yongin (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 210 days.

(21) Appl. No.: 14/996,059

(22) Filed: Jan. 14, 2016

(65) Prior Publication Data

US 2016/0212853 A1 Jul. 21, 2016

(30) Foreign Application Priority Data

Jan. 20, 2015 (KR) .................. 10-2015-0009372
Jan. 20, 2015 (KR) .................. 10-2015-0009373

(51) Int. Cl.
| | |
|---|---|
| *F21V 19/00* | (2006.01) |
| *H05K 1/18* | (2006.01) |
| *F21S 41/19* | (2018.01) |
| *F21S 41/141* | (2018.01) |
| *F21S 43/19* | (2018.01) |
| *F21S 43/14* | (2018.01) |
| *H01L 25/16* | (2006.01) |
| *H05K 1/05* | (2006.01) |
| *F21Y 103/10* | (2016.01) |

(52) U.S. Cl.
CPC ............ *H05K 1/181* (2013.01); *F21S 41/141* (2018.01); *F21S 41/192* (2018.01); *F21S 43/14* (2018.01); *F21S 43/195* (2018.01); *H05K 1/05* (2013.01); *F21Y 2103/10* (2016.08); *H01L 25/167* (2013.01); *H01L 2924/0002* (2013.01); *H05K 1/056* (2013.01); *H05K 2201/10022* (2013.01); *H05K 2201/10106* (2013.01); *H05K 2201/10174* (2013.01); *H05K 2201/10189* (2013.01)

(58) Field of Classification Search
CPC ....... H05K 1/181; H05K 1/05; F21S 48/1109; F21S 48/115; F21S 48/212; F21S 48/215
USPC ........................................... 362/382
See application file for complete search history.

(56) References Cited

U.S. PATENT DOCUMENTS

| | | | | |
|---|---|---|---|---|
| 3,783,198 | A * | 1/1974 | Couch ............... | H04Q 1/38 361/77 |
| 4,027,231 | A * | 5/1977 | Lohrmann .......... | G01R 15/04 320/136 |
| 4,211,955 | A * | 7/1980 | Ray .................. | F21V 3/00 313/500 |
| 7,098,485 | B2 * | 8/2006 | Isokawa ............. | H01L 33/54 257/98 |

(Continued)

*Primary Examiner* — Bryon T Gyllstrom
(74) *Attorney, Agent, or Firm* — Knobbe Martens Olson & Bear LLP (57) ABSTRACT

Disclosed is a light emitting diode (LED) package for a lamp of a vehicle. The LED package includes a printed circuit board (PCB) which includes a metal layer, an insulating layer formed on the metal layer, and an electric wiring layer formed on the insulating layer; an LED circuit unit which includes an LED chip mounted on the electric wiring layer; and a connector which is mounted on the electric wiring layer to be connected with the LED chip. Area and thickness of the printed circuit board and position of the LED chip on the printed circuit board can be determined based on thermal resistance of the LED chip and thermal resistance of the PCB.

7 Claims, 4 Drawing Sheets

(56) References Cited

U.S. PATENT DOCUMENTS

| | | | |
|---|---|---|---|
| 7,201,511 B2* | 4/2007 | Moriyama | F21K 9/00 257/668 |
| 7,505,109 B2* | 3/2009 | Cheng | G02B 6/0073 257/720 |
| 2003/0198048 A1* | 10/2003 | Frederick | H05B 39/00 362/249.01 |
| 2005/0024877 A1* | 2/2005 | Frederick | F21S 9/04 362/277 |
| 2006/0012991 A1* | 1/2006 | Weaver, Jr. | F21K 9/00 362/235 |
| 2006/0103320 A1* | 5/2006 | Janning | H05B 37/036 315/164 |
| 2014/0191659 A1* | 7/2014 | Wu | H05B 33/0812 315/53 |

\* cited by examiner

| No. | HORIZONTAL LENGTH :A(mm) | VERTICAL LENGTH :B(mm) | LED POSITION :B'(mm) | PCB THICKNESS :C(mm) | THERMAL RESISTANCE ($R_{JS}$) | THERMAL RESISTANCE ($R_{SB}$) | THERMAL RESISTANCE ($R_{JB}$) |
|---|---|---|---|---|---|---|---|
| 1 | 21 | 21 | 10.5 | 2 | 1.1 | 1.06 | 2.16 |
| 2 | 23 | 23 | 11.5 | 2 | 1.1 | 0.99 | 2.09 |
| 3 | 25 | 25 | 12.5 | 2 | 1.1 | 0.92 | 2.02 |
| 4 | 23 | 23 | 11.5 | 1 | 1.1 | 1.44 | 2.54 |
| 5 | 23 | 23 | 11.5 | 3 | 1.1 | 0.63 | 1.73 |
| 6 | 23 | 23 | 8.5 | 2 | 1.1 | 1.01 | 2.11 |
| 7 | 23 | 23 | 3.5 | 2 | 1.1 | 1.38 | 2.48 |
| 8 | 16 | 32 | 8 | 2 | 1.1 | 0.99 | 2.09 |

FIG. 6B

LED PACKAGE FOR LAMP OF VEHICLE

CROSS-REFERENCE TO RELATED APPLICATIONS

This application claims priority to and the benefit of Korean Patent Application No. 10-2015-0009372 and 10-2015-0009373 filed in the Korean Intellectual Property Office on Jan. 20, 2015, the entire contents of which are incorporated herein by reference.

TECHNICAL FIELD

The present disclosure relates to a light emitting diode (LED) package.

BACKGROUND

In general, a lamp refers to a device which supplies or adjusts light for a specific purpose, and is mounted in a vehicle to serve as a backlight, a display device, a lighting, a signal lamp for a vehicle, or a headlamp.

Various external or internal lamps mounted in a vehicle use an incandescent lamp, a fluorescent lamp, neon, and a light emitting diode (LED) as a light source.

Among them, the LED is an element which changes an electrical signal to infrared rays or light by using a compound semiconductor characteristic, and does not use harmful materials, such as mercury, unlike a fluorescent lamp, to minimize environmental pollution.

A lifespan of the LED is longer than those of an incandescent lamp, a fluorescent lamp, neon, and the like, and compared to an incandescent lamp, a fluorescent lamp, neon, and the like, the LED has low power consumption, has excellent visibility by a high color temperature, and causes minimal glare.

SUMMARY

When a lamp is configured by using the aforementioned LED as a light source, a degree of design freedom of the lamp can be considerably increased, and it is possible to considerably improve a commercial value of the lamp and a vehicle mounted with the lamp by several advantages, such as a long lifespan, an environment-friendly property, and lower power consumption, of the LED, so that the LED has been recently used as a light source of a headlamp for a vehicle.

When a plurality of LEDs used as a light source of a headlamp for a vehicle is provided, the plurality of LEDs is manufactured in the form of a chip, and when the LED is mounted on a printed circuit board (PCB), the LED is configured to emit light by receiving a current from an electrode formed on the PCB.

In general, the PCB is manufactured by manufacturing a substrate by adding glass fiber to a phenol resin or an epoxy resin, and then forming an electrode and a circuit pattern with a thin plate, such as copper, on the substrate.

However, for a high luminance LED, heat discharge is an important factor, so that when a general epoxy substrate is used, heat discharge performance is considerably degraded, and thus it is difficult to actually apply the epoxy substrate to the high luminance LED.

Accordingly, substrates manufactured of a metal, such as copper or aluminum, have been mainly used for the high luminance LED, and a material of the metal substrate has a high electricity conduction property, so that it is difficult to secure an insulating property between the metal substrate and an electric wire. Accordingly, the substrate is mostly applied by coating an insulating layer formed of an epoxy, and the like on an upper portion of the metal substrate.

A product, in which the PCB, the LED in the form of a chip, and various LED driving elements are combined, is generally referred to as an LED package, and the LED package may be modulated and applied to a headlamp for a vehicle and the like, so that in order to increase a degree of design freedom of the headlamp for the vehicle, the LED package needs to be formed in a small size.

However, aluminum is widely used as a metal layer of the PCB in a related technology in order to reduce cost, and aluminum has a lower thermal conductivity than that of copper, so that in order to supplement the problem, the metal layer is formed of the larger amount of aluminum than copper, and thus there is a problem in that a size of the PCB is increased.

The increase in a size of the PCB causes a decrease in a degree of design freedom of an LED lamp module including the PCB, and in order to prevent the problem, there is a need for optimizing a size of an LED package using aluminum as a metal layer of a PCB.

In the meantime, the LED package in a related technology includes a connector which is connected with various LED driving elements (a zener diode, a thermistor, and a resistor) including an LED device to transmit a voltage of a battery of a vehicle and the like to the LED device.

In the connector, a plurality of provided pins is connected to various LED driving devices, respectively, and the number of pins and electric wires of the printed circuit board are unnecessarily increased according to the connection of the plurality of pins to various LED driving elements, thereby interfering the goal of decreasing a size of the LED package.

The present disclosure has been made in an effort to provide a light emitting diode (LED) package for a lamp of a vehicle, which is capable of suppressing an increase in a size of a printed circuit board even when an aluminum metal layer is used in order to reduce cost, and increasing a degree of design freedom of the lamp for the vehicle when the LED package is applied to the lamp for the vehicle.

The present disclosure has also been made in an effort to provide a light emitting diode (LED) package for a lamp of a vehicle, which is formed to be smaller than an LED package in a related technology by decreasing the number of pins of a connector, thereby improving a degree of design freedom of a headlamp for a vehicle when being applied to a headlamp for a vehicle and the like.

An embodiment of the present invention provides a light emitting diode (LED) package for a lamp of a vehicle, including: a printed circuit board (PCB) which includes a metal layer, an insulating layer formed over the metal layer, and an electric wiring layer formed over the insulating layer; an LED circuit unit which includes an LED chip mounted over the electric wiring layer; and a connector which is mounted over the electric wiring layer to be connected with the LED chip. Area and thickness of the printed circuit board (PCB) can be determined using sum of thermal resistance of the LED chip and thermal resistance of the PCB. Also a location of the printed circuit board where the LED chip is mounted can be determined using the sum of thermal resistance of the LED chip and thermal resistance of the PCB. A thickness of the insulating layer may be 30 μm to 50 μm.

The metal layer may be formed of aluminum.

A thickness of the metal layer may be 1.5 mm or less.

A width of the PCB may be 16 mm to 18 mm, and a height of the PCB may be 32 mm to 37 mm, and the LED chip may be positioned while being spaced apart from one border of the PCB by 8.5 to 10 mm.

The LED circuit unit may further include a zener diode, a thermistor, and a resistor which are mounted on the electric wiring layer.

The connector may include at least four pins, and a first one of the four pins of the connector may be commonly connected to one end of each of the LED chip, the zener diode, the thermistor, and the resistor.

An embodiment of the present invention provides a light emitting diode (LED) package for a lamp of a vehicle, including: a printed circuit board (PCB) including an electric wiring layer; an LED circuit unit including an LED chip, a zener diode, a thermistor, and a resistor which are mounted on the electric wiring layer; and a connector provided with at least four pins, in which one end of each of the LED chip, the zener diode, the thermistor, and the resistor is commonly connected with any one of the four pins of the connector.

Any one pin of the connector may have a negative polarity.

The other end of the LED chip may be connected to a second pin among the four pins of the connector.

The other end of the thermistor may be connected to a third pin among the four pins of the connector.

The other end of the resistor may be connected to the last pin among the four pins of the connector.

The other end of the zener diode may be connected to a pin of the connector together with the other end of the LED chip.

The PCB may further include: a metal layer; and an insulating layer formed on the metal layer, and the electric wiring layer may be formed on the insulating layer.

A width of the PCB may be 16 mm to 18 mm, and a height of the PCB may be 32 mm to 37 mm.

According to the LED package for the lamp of the vehicle according to an embodiment of the present invention, it is possible to increase a degree of design freedom of a lamp for a vehicle when the LED package is applied to the lamp for the vehicle by optimizing a size of the PCB which includes the aluminum metal layer in order to reduce cost.

The metal layer of the PCB is formed of aluminum, not copper, so that it is possible to reduce cost compared to the LED package in a related technology.

It is also possible to reduce cost compared to the LED package in a related technology by optimizing a size of the PCB and simplifying the electric wires by decreasing the number of pins of the connector mounted on the PCB.

Further, the electric wires are simplified due to the decrease in the number of pins of the connector, so that it is possible to form the LED package to be smaller than the LED package in a related technology.

In addition, the LED package for the lamp of the vehicle according to an embodiment of the present invention may be formed to be smaller than the LED package in a related technology, so that it is possible to improve a degree of design freedom of a headlamp for a vehicle when the LED package for the lamp of the vehicle according to an embodiment of the present invention is applied to a headlamp for a vehicle and the like.

The foregoing summary is illustrative only and is not intended to be in any way limiting. In addition to the illustrative aspects, embodiments, and features described above, further aspects, embodiments, and features will become apparent by reference to the drawings and the following detailed description.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, embodiments of the present invention will be described in detail with reference to the accompanying drawings.

In order to sufficiently understand the present invention, the operational advantages of the present invention, and the objects achieved by carrying out the present invention, the accompanying drawings illustrating embodiments of the present invention and the contents described therein need to be referred to.

Hereinafter, the present invention will be described in detail by describing an embodiment of the present invention with reference to the accompanying drawings. However, the present invention may be implemented in various different ways, and is not limited to an embodiments to be described below. Further, in order to clearly describe the present invention, parts irrelevant to the description are omitted, and the same reference number refers to the same member in the drawings.

Throughout the specification, unless explicitly described to the contrary, the word "comprise" and variations such as "comprises" or "comprising" will be understood to imply the inclusion of stated elements but not the exclusion of any other elements.

Figure 1:
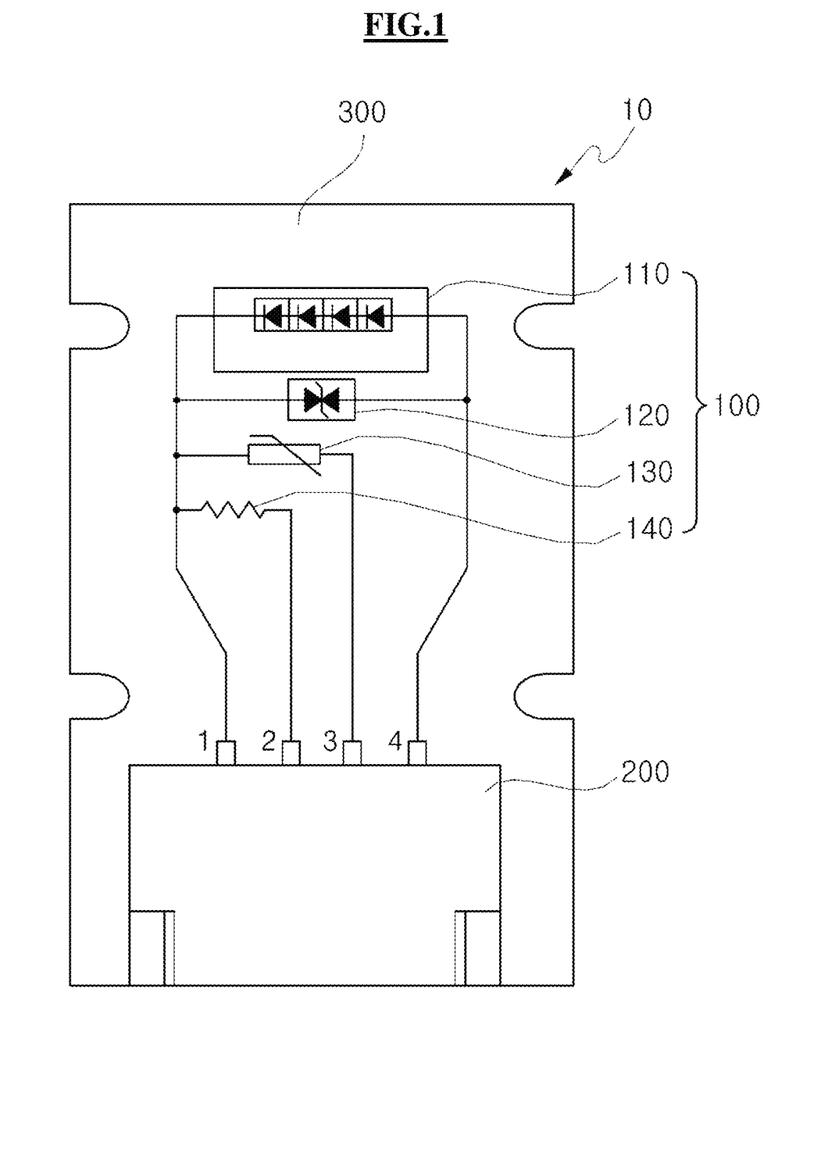
FIG. 1 is a top plan view of a light emitting diode (LED) package for a lamp of a vehicle according to an embodiment of the present invention.

Referring to FIG. 1, a light emitting diode (LED) package 10 for a lamp of a vehicle according to an embodiment of the present invention may be applied to a headlamp for a vehicle in a state where a plurality of LED packages 10 is modulated, and in this case, the LED packages 10 may include an LED circuit unit 100, a connector 200, and a printed circuit board (PCB) 300 as a light emitting component used as a light source of the headlamp for the vehicle.

The LED circuit unit 100 is an assembly of various elements required for converting a voltage received from a battery of a vehicle and the like into light, and may include an LED chip 110, a zener diode 120, a thermistor 130, a resistor 140, and the like.

The LED chip 110 may be formed of a plurality of LED devices. The LED devices configuring the LED chip 110 are substantially light emitting elements which convert a voltage received from a battery of a vehicle into infrared rays or light. The LED chip 110 may include four or five LED devices.

The LED chip may be a detachable surface embedded type, and be easily replaced with a new LED chip when damaged and the like.

The zener diode 120 is a constant voltage device connected to both side ends of the LED chip 110 so that a predetermined voltage is applied to the LED chip 110. The zener diode 120 may protect the LED chip 110 from being damaged due to an excessive voltage by preventing the excessive voltage from being applied to the LED chip 110.

The thermistor 130 is a resistor device provided for compensating for a characteristic change of the LED device according to a temperature change. The thermistor 130 is a resistor having a negative (−) temperature coefficient indicating that a resistance value is decreased according to an increase in a temperature. The thermistor 130 may compensate for a change in a characteristic of the LED device by the aforementioned characteristic. The thermistor 130 may improve accuracy in a constant current control for the LED chip 110 by compensating for a change in a characteristic of the LED device.

The resistor 140 has a resistance value which is not changed even if a temperature is changed unlike the thermistor 130, and is provided for discriminating a rank of the LED chip 110. Here, when the LED chip 110 is modulated so as to be applied to a lamp, the LED chip 110 is modulated with other LED chips having ranks as similar as possible, and the resistor 140 has an appropriate resistance value in order to adjust the rank of the LED chip 110.

The connector 200 is an electronic component which electrically connects a power supply, such as the battery of the vehicle, and the LED chip 110, the zener diode 120, the thermistor 130, and the resistor 140 which are described above.

The connector 200 includes four pins, and each pin may be connected with at least one device of the LED chip 110, the zener diode 120, the thermistor 130, and the resistor 140. Here, the pins may be connected with the LED chip 110, the zener diode 120, the thermistor 130, and the resistor 140 through electric wires formed on the PCB 300.

Figure 2:
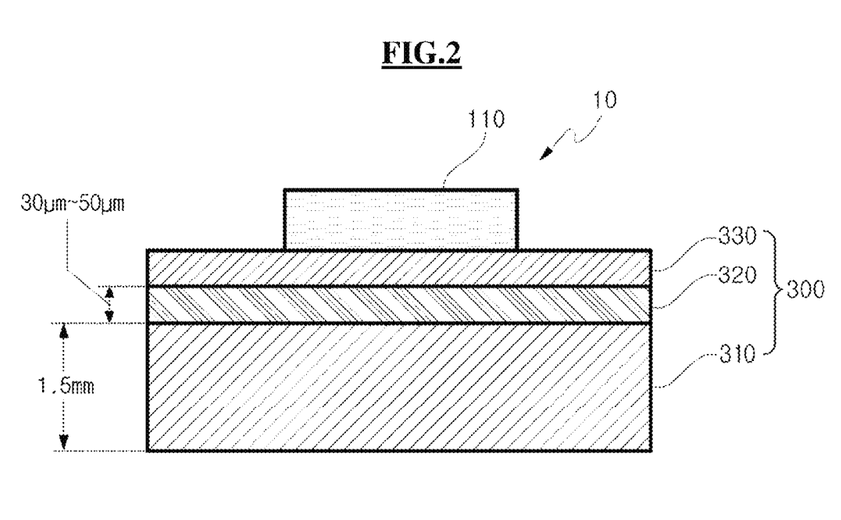
FIG. 2 is a side view of the LED package for the lamp of the vehicle according to an embodiment of the present invention.

Referring to FIG. 2, the PCB 300 is a body part of the LED package 10, in which the LED circuit unit 100 and the connector 200 are mounted, and may include a metal layer 310, an insulating layer 320, and an electric wiring layer 330 on which the aforementioned electric wires are formed.

The metal layer 310 of the PCB 300 is positioned at a lower side based on the entire PCB 300. The metal layer 310 may be formed of aluminum. A thickness of the metal layer 310 may be 1.5 mm or less. The metal layer, which is formed of copper in a related technology, is formed of aluminum, so that there is an effect in reducing cost compared to the LED package 10 in a related technology.

The metal layer 310 may appropriately distribute heat generated when various devices of the LED circuit unit 100 are operated by a current flowing in the electric wires, and prevent the LED circuit unit 100 from being damaged due to heat emission.

The insulating layer 320 of the PCB 300 is formed on the metal layer 310, and is formed of an insulating material, such as epoxy. A thickness of the insulating layer 320 may be 30 μm to 50 μm.

When a current flows through the electric wires formed on the electric wiring layer 330, the insulating layer 320 serves to perform insulation so that the current flowing through the electric wires does not flow to the metal layer 310.

The electric wiring layer 330 of the PCB 300 is formed on the insulating layer 320. The electric wiring layer 330 is provided with the electric wires for connecting various devices of the LED circuit unit 100 with the pins of the connector 200.

Here, total thickness of the PCB 300 is a thickness that is obtained by summing thicknesses of the metal layer 310, the insulating layer 320, and the electric wiring layer 330, and the thickness of the electric wiring layer 330 is rarely considered.

Referring back to FIG. 1, when the LED circuit unit 100 and the connector 200 are mounted, the electric wire formed on the electric wiring layer 330 may be formed so that a first pin of the connector 200 is connected with one end of each of the LED chip 110, the zener diode 120, the thermistor 130, and the resistor 140 of the LED circuit unit 100.

The electric wire may be formed so that a second pin of the connector 200 is connected to the other end of the resistor 140. The electric wire may be formed so that a third pin of the connector 200 is connected to the other end of the thermistor 130. The electric wire may be formed so that a fourth pin of the connector 200 is connected to the other ends of the LED chip 110 and the zener diode 120.

Here, the first pin of the connector 200 is connected with a vehicle body to be utilized as a common negative electrode, that is, a common ground, and the second, third, and fourth pins of the connector 200 are connected with the battery of the vehicle and the like to be used as positive electrodes.

Most of the vehicle body is utilized as the common negative electrode (common ground), so that a voltage reference may be set as 0 V, and thus, one end of each of the LED chip 110, the zener diode 120, the thermistor 130, and the resistor 140 may be joined as the common ground.

Accordingly, the number of pins of the connector may be four, which is smaller than that of a related technology, the electric wires may be simplified, and the LED package 10 may be manufactured to be smaller than the LED package in a related technology.

Figure 3:
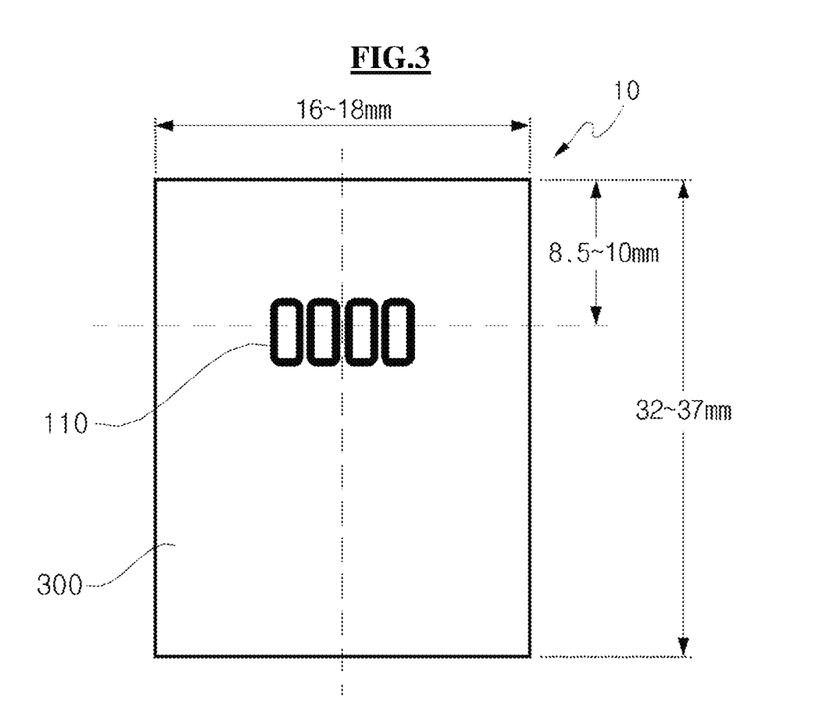
FIG. 3 is a schematic top plan view for describing a size of the LED package for the lamp of the vehicle according to an embodiment of the present invention.

Referring to FIG. 3, it is possible to confirm a size of the LED package 10 according to an embodiment of the present invention.

The LED package 10 according to an embodiment of the present invention may be formed to be smaller than the LED package in a related technology by decreasing the number of pins of the connector 200 and simplifying the electric wires as described above, and a width of an area thereof may be 16 to 18 mm, and a height thereof may be 32 to 37 mm. Here, when the size of the LED package 10 is set as described above, it is possible to minimize an increase in thermal resistance according to the metal layer of the PCB 300 formed of aluminum, and decrease a risk, such as damage to the PCB 300, due to an increase in thermal resistance.

The LED chip 110 may be positioned at a center in a width direction of the PCB 300, and positioned while being spaced apart from one border by 8.5 to 10 mm in a height direction thereof, and thus it is possible to further minimize thermal resistance of the PCB 300.

Accordingly, the electric wires are simplified through the decrease in the number of pins of the connector 200, so that it is possible to form the LED package to be smaller than the LED package in a related technology.

The LED package may be formed to be smaller than the LED package in a related technology, so that when the LED package 10 according to an embodiment of the present invention is applied to the headlamp for the vehicle, a degree of design freedom of the headlamp for the vehicle is increased.

Figure 4:
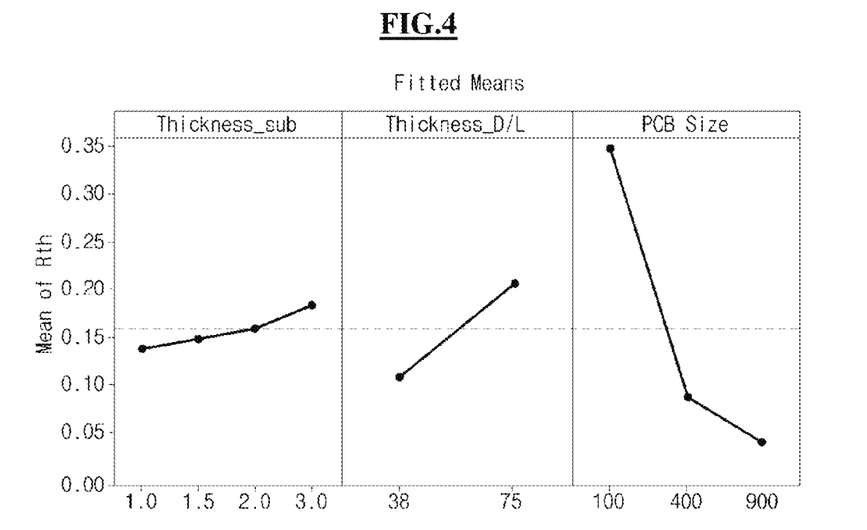
FIG. 4 is a first graph for describing correlations between changes of various design factors determining a size of the LED package for the lamp of the vehicle according to an embodiment of the present invention and thermal resistance.
Figure 5:
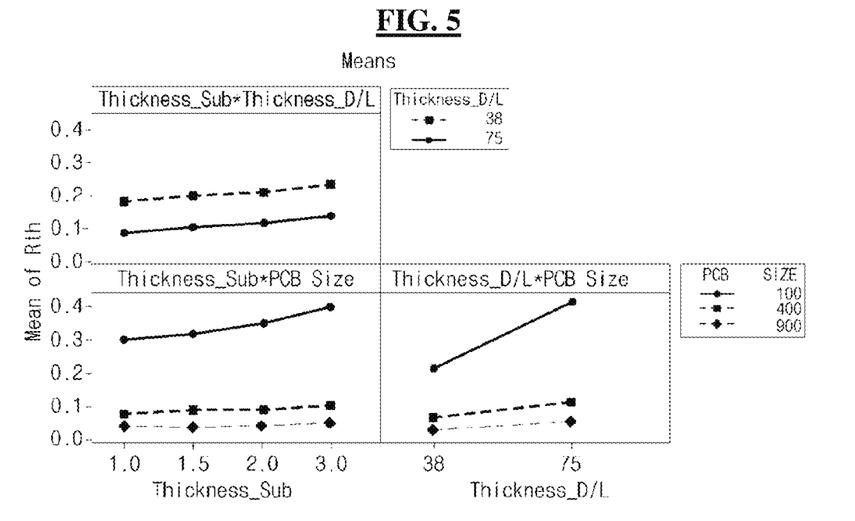
FIG. 5 is a second graph for describing correlations between changes of various design factors determining a size of the LED package for the lamp of the vehicle according to an embodiment of the present invention and thermal resistance.
Figure 6A:
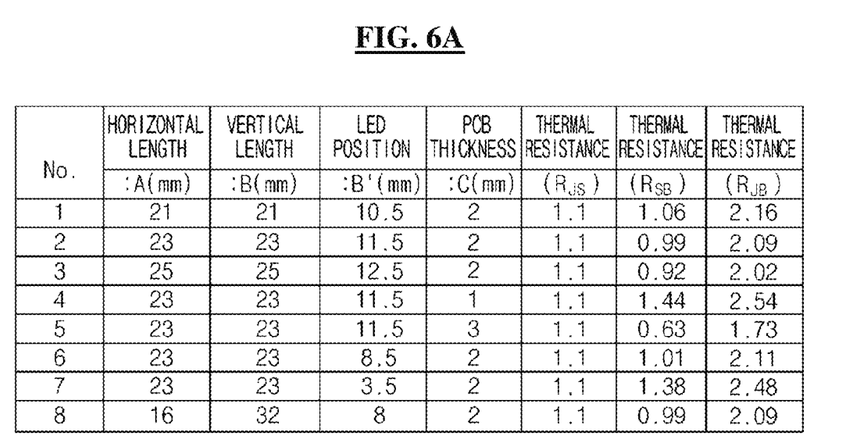
FIG. 6A and FIG. 6B are diagrams for describing correlations between various design factors determining a size of the LED package for the lamp of the vehicle according to an embodiment of the present invention, a position of an LED chip over the printed circuit board, and thermal resistance.
Figure 6B:
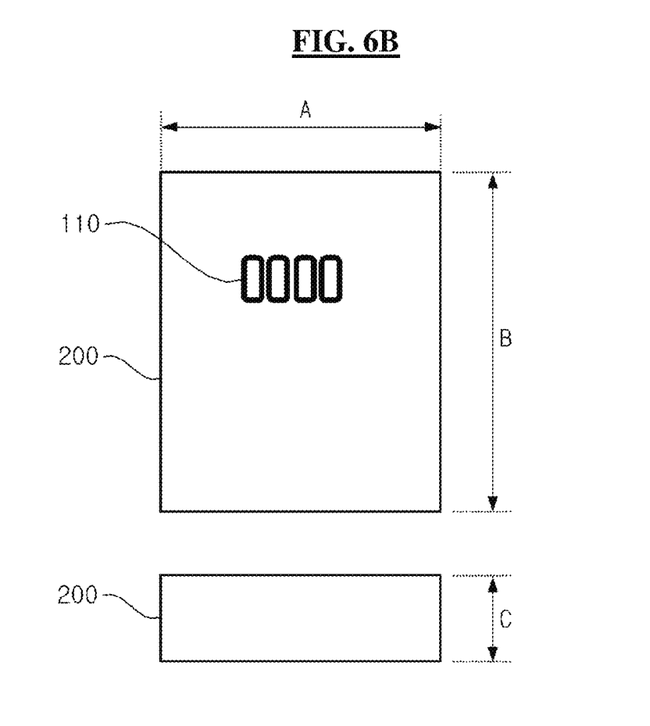

Referring to FIGS. 4 to 6, it is possible to confirm experimental data supporting whether a size of the LED package 10 set so as to minimize thermal resistance of the PCB 300 is effective.

In FIGS. 4 and 5, Fitted Means refers to a value of each of design factors (Thickness_Sub, Thickness_D/L, and PCB Size) determining a size of the PCB 300, Mean of Rth refers to a thermal resistance value, Thickness_Sub refers to a thickness of the metal layer 310, Thickness_D/L refers to a thickness of the insulating layer 320, and PCB size represents an area of the PCB 300.

In FIGS. 6A and 6B, a horizontal length A refers to a width of the PCB 300, a vertical length B refers to a height of the PCB 300, an LED position B represents a length between the LED chip 110 and one side of the PCB 300, and a PCB thickness C represents a thickness obtained by summing thicknesses of the metal layer 310, the insulating layer 320, and the electric wiring layer 330. Here, the LED position is included in the design factor.

Thermal resistance RJS refers to thermal resistance of the LED chip 110, thermal resistance RSB refers to thermal resistance of the PCB 300, and thermal resistance RJB represents thermal resistance of the entire LED package 10 obtained by summing thermal resistance of the LED chip 110 and thermal resistance of the PCB 300.

Referring back to FIG. 4, when a thickness of the metal layer 310 is changed from 1.0 cm to 3.0 cm, thermal resistance is slightly increased from about 0.14 $m^2K/W$ to 0.18 $m^2K/W$, but when a thickness of the insulating layer 320 is changed from 38 μm to 75 μm, thermal resistance is considerably increased from about 0.10 $m^2K/W$ to 0.21 $m^2K/W$, and further, when an area of the PCB 300 is changed from 100 (10×10 $mm^2$) to 900 (30×30 $mm^2$), thermal resistance is considerably decreased from about 0.35 $m^2K/W$ to 0.04 $m^2K/W$.

As described above, it can be seen that the thermal resistance for each design factor is considerably influenced by the thickness of the insulating layer 320 and the area of the PCB 300. Here, watt (W) used in the LED package 10 may be 10 W.

Referring to FIG. 5, it is possible to confirm thermal resistance according to a mutual operation of two design factors, not one design factor, and it is represented that thermal resistance according to a mutual operation between a thickness of the metal layer 310 and a thickness of the insulating layer 320 is about 0.1 $m^2K/W$ when a thickness of the insulating layer 320 is 38 μm, and about 0.2 $m^2K/W$ when a thickness of the insulating layer 320 is 75 μm.

It is represented that thermal resistance according to a mutual operation between a thickness of the metal layer 310 and an area of the PCB 300 is about 0.05 $m^2K/W$ when an area of the PCB 300 is 900 (30×30 $mm^2$), from about 0.08 $m^2K/W$ to 0.1 $m^2K/W$ when an area of the PCB 300 is 400 (2×20 $mm^2$), and from about 0.3 $m^2K/W$ to 0.4 $m^2K/W$ when an area of the PCB 300 is 100 (10×10 $mm^2$).

It is represented that thermal resistance according to a mutual operation between a thickness of the insulating layer 320 and an area of the PCB 300 is from about 0.05 $m^2K/W$ to 0.06 $m^2K/W$ when an area of the PCB 300 is 900 (30×30 $mm^2$), from about 0.08 $m^2K/W$ to 0.12 $m^2K/W$ when an area of the PCB 300 is 400 (20×20 $mm^2$), and from about 0.21 $m^2K/W$ to 0.4 $m^2K/W$ when an area of the PCB 300 is 100 (10×10 $mm^2$).

When desirable values of the design factors are set so as to minimize the thermal resistance, a thickness of the metal layer 310 may be set as 1.5 mm or less, a thickness of the insulating layer 320 may be set as 30 μm to 50 μm, a width of the PCB 300 may be set as 16 mm to 18 mm, a height of the PCB 300 may be set as 32 mm to 37 mm, and the total thickness of the PCB 300 may be set as 2.0 mm or less.

Referring to FIGS. 6A and 6B, FIG. 6A represents thermal resistances RJS, RSB, and RJB according to eight combinations of the design factors, and FIG. 6B represents parts of the LED package 10 which the design factors indicate.

The desirable values of the design factors may be set based on eight combinations, and combination No. 5 has the lowest thermal resistance, but is disadvantageous in a degree of design freedom of a lamp for a vehicle because a thickness of the PCB 300 is largest, and combination No. 3 has the next lowest thermal resistance, but is disadvantageous in a degree of design freedom of a lamp for a vehicle because an area of the PCB 300 according to a horizontal length and a vertical length is large.

Combination No. 4 is advantageous in a degree of design freedom of a lamp for a vehicle because a thickness of the PCB 300 is smallest, but since thermal resistance is excessively high, the LED package 10 may be damaged due to heat emission.

Accordingly, in consideration but with exception of combinations Nos. 3, 4, and 5, a size of the LED package 10 may be determined as described above based on combination Nos. 2 and 8 having the lowest thermal resistance.

The LED package 10 formed according to the design factors having the desirable values may minimize thermal resistance increase risk due to the use of an aluminum material, and a size thereof is minimized, so that it is possible to improve a degree of design freedom of a headlamp for a vehicle when the LED package 10 is applied to the headlamp for the vehicle and the like.

As described above, embodiments of the present invention have been described and illustrated in the drawings and the specification. The embodiments were chosen and described in order to explain certain principles of the invention and their practical application, to thereby enable others skilled in the art to make and utilize various embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A light emitting diode (LED) package for a lamp of a vehicle, comprising:
   a printed circuit board (PCB);
   an LED circuit unit including an LED chip, a zener diode, a thermistor, and a resistor mounted on the PCB, each of the LED chip, the zener diode, the thermistor and the resistor comprising first and second terminals for electrical connection;
   a connector for connecting the LED circuit unit to at least one battery of the vehicle and to a common ground of vehicle body, the connecter comprising a first pin, a second pin, a third pin and a fourth pin;
   a first wire connecting the first pin or the connector to the first terminal of the LED chip;
   a second wire connecting the second pin of the connector to the first terminal of the thermistor;
   a third wire connecting the third pin of the connector to the first terminal of the resistor; and
   a fourth wire connecting the fourth pin of the connector to the second terminal of each of the LED chip, the thermistor and the resistor via their second terminals,
   wherein the first, second, third and fourth wires are not electrically connected to each other on the LED package such that the fourth pin provides a common ground connection for all of the LED chip, the thermistor and the resistor.

2. The LED package of claim 1, wherein the zener diode is electrically connected to the LED chip in parallel.

3. The LED package of claim 1, wherein the printed circuit board comprises metal layer, an insulating layer formed over the metal layer, and an electric wiring layer formed over the insulating layer.

4. The LED package of claim 3, wherein a width of the printed circuit board is 16 mm to 18 mm, and a height of the PCB is 32 mm to 37 mm.

5. The LED package of claim 3, wherein the metal layer is formed of aluminum.

6. The LED package of claim 5, wherein the thickness of the metal layer is 1.5 mm or less.

7. The LED package of claim 1, wherein a width of the PCB is 16 mm to 18 mm, and a height of the PCB is 32 mm to 37 mm, and the LED chip is positioned while being spaced apart from one border of the PCB by 8.5 to 10 mm.

* * * * *